United States Patent
Kandola et al.

(10) Patent No.: US 7,486,937 B2
(45) Date of Patent: Feb. 3, 2009

(54) EFFICIENT RF AMPLIFIER TOPOLOGIES

(75) Inventors: Gurmail Kandola, Milpitas, CA (US); Adya S. Tripathi, San Jose, CA (US)

(73) Assignee: Cirrus Logic, Inc., San Jose, CA (US)

( * ) Notice: Subject to any disclaimer, the term of this patent is extended or adjusted under 35 U.S.C. 154(b) by 510 days.

(21) Appl. No.: 11/433,796

(22) Filed: May 11, 2006

(65) Prior Publication Data

US 2007/0004343 A1    Jan. 4, 2007

Related U.S. Application Data

(60) Provisional application No. 60/683,123, filed on May 17, 2005.

(51) Int. Cl.
*H04B 1/38* (2006.01)

(52) U.S. Cl. .............. 455/73; 455/103; 455/127.1

(58) Field of Classification Search ......... 455/73, 455/78, 550.1, 552.1, 553.1, 91, 103, 115.1, 455/127.1, 127.2, 127.4

See application file for complete search history.

(56) References Cited

U.S. PATENT DOCUMENTS

| | | | |
|---|---|---|---|
| 5,777,512 A | 7/1998 | Tripathi | |
| 5,974,089 A | 10/1999 | Tripathi et al. | |
| 6,473,600 B1 | 10/2002 | Dvorkin | |
| 6,621,339 B2 | 9/2003 | Tripathi | |
| 6,628,166 B2 | 9/2003 | Delano | |
| 6,714,760 B2 * | 3/2004 | Robinett | 455/78 |
| 2002/0068530 A1 * | 6/2002 | Li | 455/82 |
| 2005/0079825 A1 * | 4/2005 | Omori et al. | 455/115.1 |

* cited by examiner

*Primary Examiner*—Thanh C Le
(74) *Attorney, Agent, or Firm*—Weaver Austin Villeneuve & Sampson LLP

(57) ABSTRACT

Power-efficient front-end topologies for radio frequency power amplifiers are described which may be used to implement full-duplex transceivers for wireless mobile terminals such as, for example, cellular phones. At least some of the described topologies employ highly efficient power amplifiers having well-optimized global feedback loops with noise-shaping capability.

18 Claims, 6 Drawing Sheets

EFFICIENT RF AMPLIFIER TOPOLOGIES

RELATED APPLICATION DATA

The present application claims priority under 35 U.S.C. 119(e) to U.S. Provisional Patent Application No. 60/683,123 filed May 17, 2005, the entire disclosure of which is incorporated herein by reference for all purposes.

BACKGROUND OF THE INVENTION

The present invention relates to improving the efficiency of amplifiers and, in particular, a new and efficient front-end topology for radio frequency power amplifiers.

Battery power consumption (which translates to "talk time") is a major consideration in wireless mobile terminals like cellular or cordless phones. Most of the power in such devices is consumed by the radio frequency (RF) power amplifier, or RF PA. The efficiency of an RF PA is defined as the RF output power divided by the DC power consumed from the battery. RF PAs are designed to provide a certain maximum RF power ($P_{max}$) with required linearity. As a result, the efficiency of an RF PA is generally higher at $P_{max}$. However, mobile devices typically spend most of the time transmitting at power levels which are much lower than $P_{max}$. This happens, for example, when the mobile device is relatively close to a base station. Unfortunately, the efficiency of mobile devices under these conditions is typically very poor.

A variety of approaches to solving this issue have been proposed. According to one approach, the RF PA in the output power stage is dynamically re-biased to improve efficiency at lower power levels. However, such power stages are designed to handle high power levels and are therefore optimized for high power operation. Thus, when they are re-biased for low power operation, they tend to operate less efficiently than smaller, low power stages which are optimized for such power levels.

According to another approach in which power amplification is accomplished in multiple stages, a low power transmit path to a second antenna is provided which is driven by a pre-amplifier which is in series with or is part of the main RF PA. During low power operation, the main RF PA is turned off or quiesced, thus reducing power consumption and improving device efficiency. However, because this approach relies on amplification in the main transmit path, the low power transmit path remains on during higher power operation, representing an undesirable inefficiency. In addition, the pre-amplifier which drives the low power transmit path is not optimized for that purpose.

Thus, while existing approaches to improving RF PA efficiency at low power levels have made some inroads, there is still considerable room for improvement.

SUMMARY OF THE INVENTION

According to a specific embodiment of the present invention, a transceiver is provided. A modulator stage is operable to receive an input signal and generate a modulated signal. A band pass filter is operable to filter the modulated signal and generate a filtered signal. A first transmit path including a first amplifier is operable in a first transmit mode to receive the filtered signal and generate a first amplified signal. The first amplified signal is characterized by a first power range. A first antenna associated with the first transmit path is operable to transmit the first amplified signal. A second transmit path including a second amplifier is operable in a second transmit mode to receive the filtered signal and generate a second amplified signal. The second amplified signal is characterized by a second power range lower than the first power range. A second antenna associated with the second transmit path is operable to transmit the second amplified signal. A switch is operable to alternately provide the filtered signal to the first and second transmit paths. Control circuitry is operable to disable the first amplifier in the second transmit mode, and to disable the second amplifier in the first transmit mode.

According to another specific embodiment, another transceiver is provided. A modulator stage is operable to receive an input signal and generate a modulated signal. A band pass filter is operable to filter the modulated signal and generate a filtered signal. A first transmit path is operable in a first transmit mode to receive the filtered signal. The filtered signal is characterized by a first power range. A second transmit path including a first amplifier is operable in a second transmit mode to receive the filtered signal and generate a first amplified signal. The first amplified signal is characterized by a second power range higher than the first power range. A first antenna associated with the first and second transmit paths is operable to transmit the filtered signal in the first transmit mode and the first amplified signal in the second transmit mode. A third transmit path including a second amplifier is operable in a third transmit mode to receive the first amplified signal and generate a second amplified signal. The second amplified signal is characterized by a third power range higher than the second power range. A second antenna associated with the second transmit path is operable to transmit the second amplified signal. A first switch is operable to alternately provide the filtered signal to the first and second transmit paths. A second switch is operable to alternately provide the first amplified signal to the second and third transmit paths. Control circuitry is operable to disable the first and second amplifiers in the first transmit mode, and to disable the second amplifier in the second transmit mode.

A further understanding of the nature and advantages of the present invention may be realized by reference to the remaining portions of the specification and the drawings.

DETAILED DESCRIPTION OF SPECIFIC EMBODIMENTS

Reference will now be made in detail to specific embodiments of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims. In the following description, specific details are set forth in order to provide a thorough understanding of the present invention. The present invention may be practiced without some or all of these specific details. In addition, well known features may not have been described in detail to avoid unnecessarily obscuring the invention.

According to various embodiments of the invention, power-efficient front-end topologies for radio frequency power amplifiers (RF PAs) are provided which may be used to implement a full-duplex transceiver to replace those typically found in wireless mobile terminals such as, for example, cellular phones. According to some of these embodiments, such topologies employ highly efficient power amplifiers having well-optimized global feedback loops with noise-shaping capability.

Figure 1:
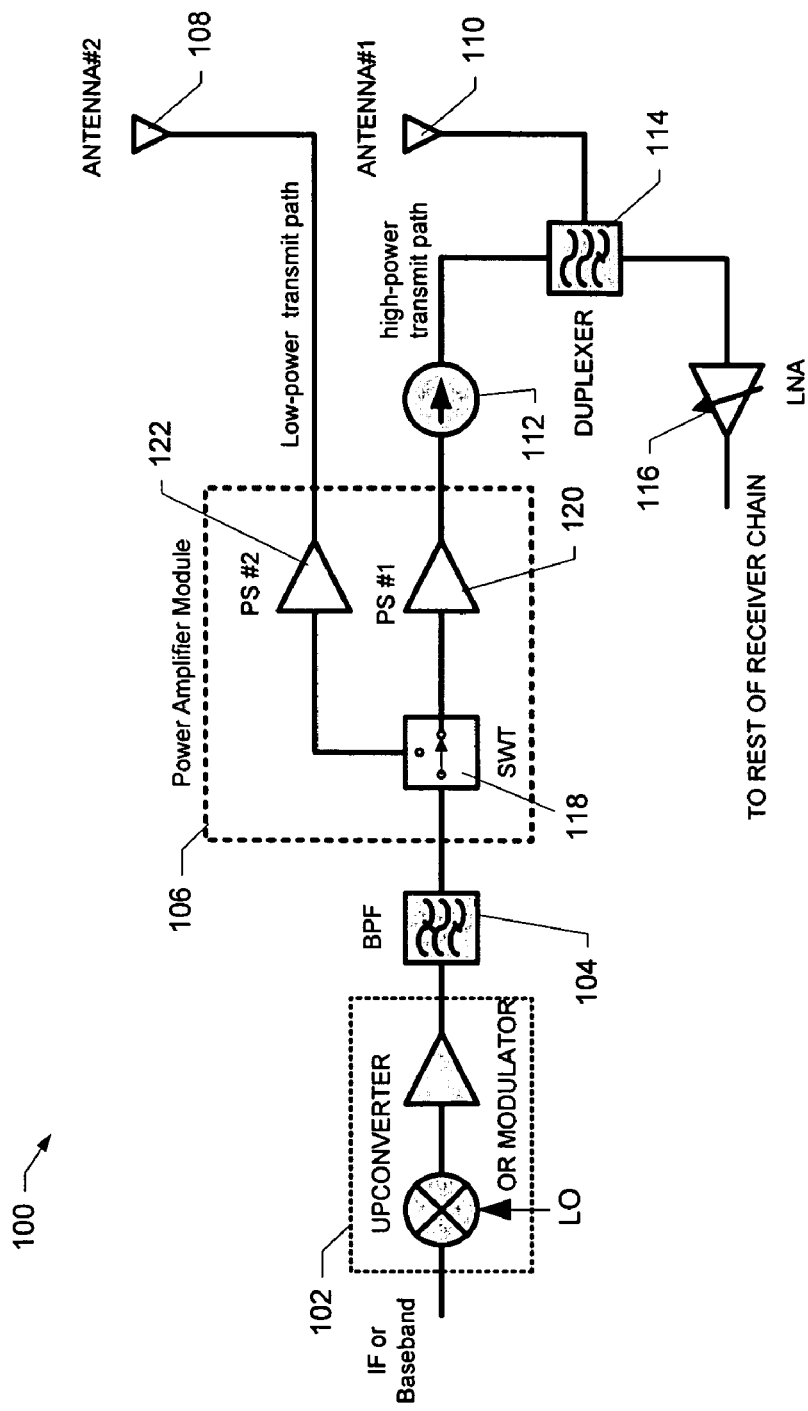
FIG. 1 is a simplified block diagram of an efficient RF amplifier designed according to a specific embodiment of the invention.

FIG. 1 is a simplified block diagram of a full-duplex transceiver 100 which may be used, for example, in wireless mobile terminals such as CDMA, CDMA2000, and WCDMA/JUMTS cellular phones, and cordless phones. The information signal to be transmitted to another device (e.g., a base-station) goes though a number of processing blocks which perform various functions like frequency conversion (102), filtering (104), power amplification (106), and finally radiation via an antenna (108 or 110). Preliminary processing blocks that transform the signal into base band or IF (intermediate frequency) format are not shown in the diagram so as not to unnecessarily obscure the important features of the depicted embodiment.

Once the signal is in base band or IF format, it is applied to upconverter/modulator block 102 along with the output of a local oscillator (LO). This block transforms the signal into a radio frequency (RF) format which is the center (i.e., carrier) frequency. The upconverted or modulated signal is then fed into a band pass filter (BPF) 104 which removes or minimizes unwanted spurs, images (if any), and broadband noise. The portion of the broadband noise commonly referred to as receive-band noise (because it falls in the unit's receive channel) requires special attention because it can pass through succeeding blocks and eventually appear at the beginning of the unit's receive-chain, thus desensitizing the receiver. Because the receiver can't distinguish such noise from the actual signal it is supposed to be receiving, this can lead to undesirable results, e.g., call dropouts in cellular phones.

According to the implementation shown, the output of BPF 104 is fed into power amplification module 106 which includes two power amplification transmit paths. As shown in the high-power transmit path, an isolator 112 may be used to protect the power amplifier from large-voltage standing waves which may result from changes in impedance at antenna 110. Such waves can damage the final transistor in the power amplifier.

After isolator 112, the signal enters a duplexer 114 that may provide further filtering (i.e., in addition to that provided by BPF 104). That is, duplexer 114 may help reduce transmitter spurs appearing at the antenna and/or reduce the magnitude of unwanted interferences that may disturb the receiver. Duplexer 114 has three terminals one of which is connected to a low-noise amplifier (LNA) 116, i.e., the first active block in the receive-chain. Receive-band noise may be reduced by as much as 35 dB or more by duplexer 114 so that it does not appear at the input to LNA 116 with significant strength. It should be noted that inclusion of a duplexer is not required to be within the scope of the invention. That is, embodiments are contemplated in which the receive path has its own dedicated antenna.

Referring back to power amplification module 106, the full-duplex mobile terminal of FIG. 1 is made more efficient with the introduction of a second transmit path following BPF 104. Switching device 118 switches between the two transmit paths which are alternately enabled in low-power and high-power modes. According to various embodiments, switching device 118 may be any branching device where RF signals can be diverted to one of two output terminals.

The high-power transmit path includes a power amplifier 120 which, according to a specific embodiment, is optimized for high-power operation, e.g., approximately 16 dBm to Pmax, where Pmax is 28 dBm at the amplifier output for CDMA or CDMA2000, and 27 dBm for WCDMA. The amplified signal from amplifier 120 is transmitted by antenna 110 via isolator 112 and duplexer 114. When the unit is operating in its low-power mode, amplifier 120 is disabled (i.e., turned off or quiesced in some way) such that its power consumption is either eliminated or greatly reduced. The control circuitry for effecting this may be implemented in a wide variety of ways as there are many ways in which to achieve this control which are within the understanding of one of skill in the art, e.g., removal of power, switching specific transistors off, etc.

The low-power transmit path includes an independent power amplifier 122 which, according to a specific embodiment, is optimized for low-power operation, e.g., −50 dBm to 16 dBm. In the embodiment shown, the amplified signal from amplifier 122 is transmitted by a dedicated antenna 108. As with amplifier 120, during high-power operation amplifier 122 is disabled. This is made possible by the independence of the amplifiers in the respective transmit paths. That is, the low-power mode amplification is not solely dependent on the amplification in the main or high-power transmit path.

Figure 4:
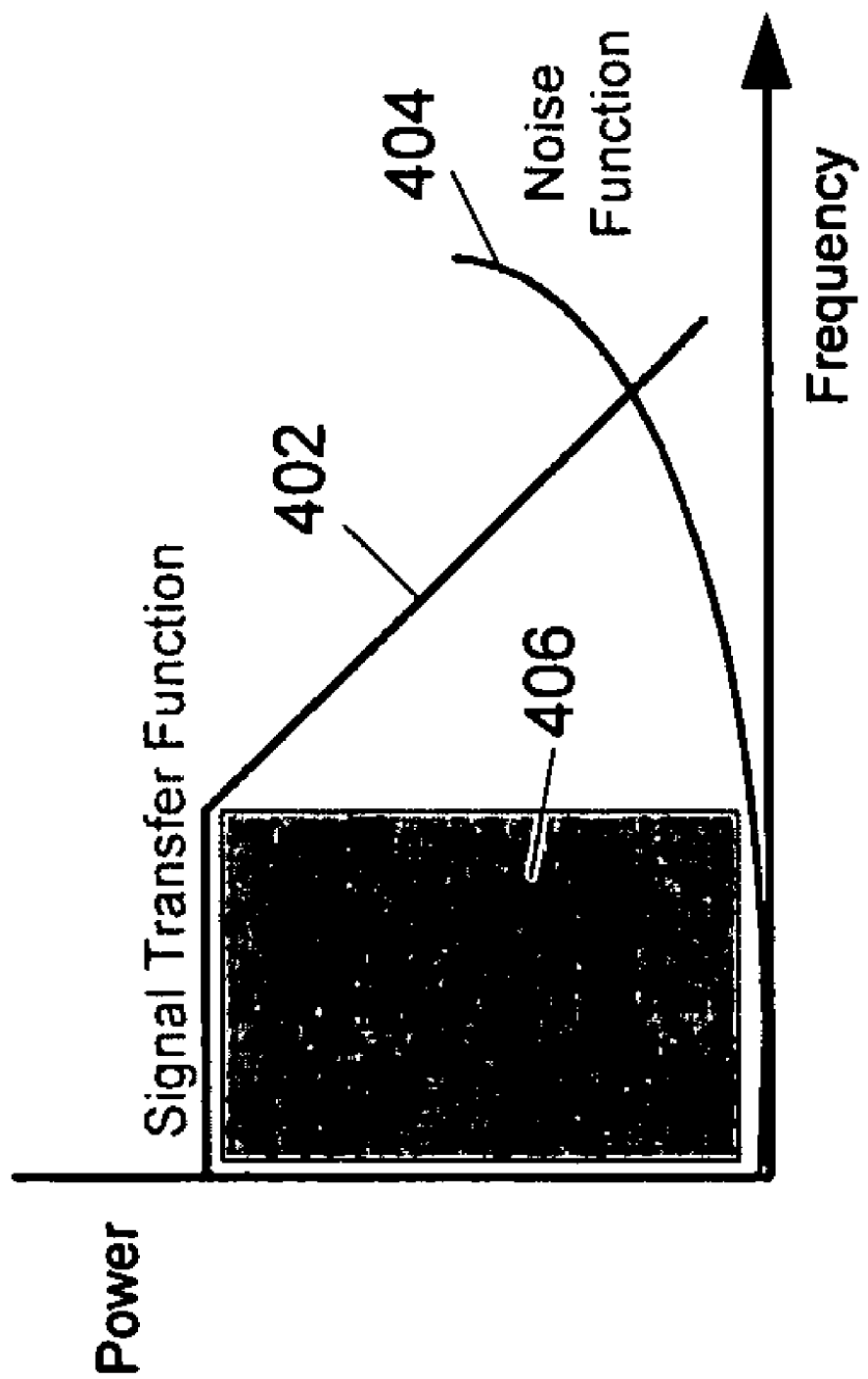
FIG. 4 is a graph illustrating base band noise shaping.
Figure 5:
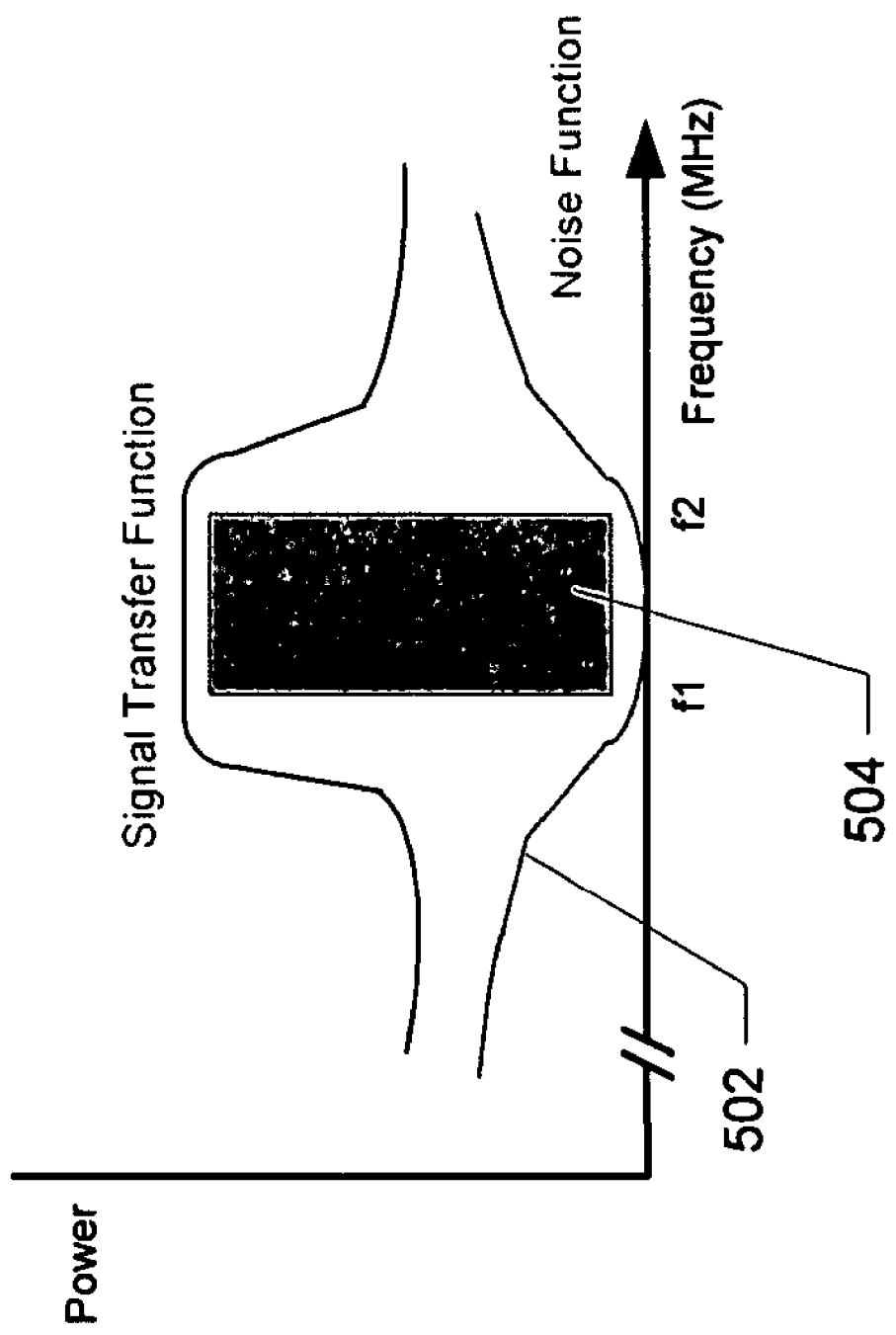
FIG. 5 is a graph illustrating band pass noise shaping.

As mentioned above and according to specific embodiments of the invention, either or both of amplifiers 120 and 122 may be implemented as highly efficient power amplifiers using well-optimized global feedback loops with noise-shaping capability. A specific implementation of such an amplifier is discussed below with reference to FIGS. 4-6.

Figure 2:
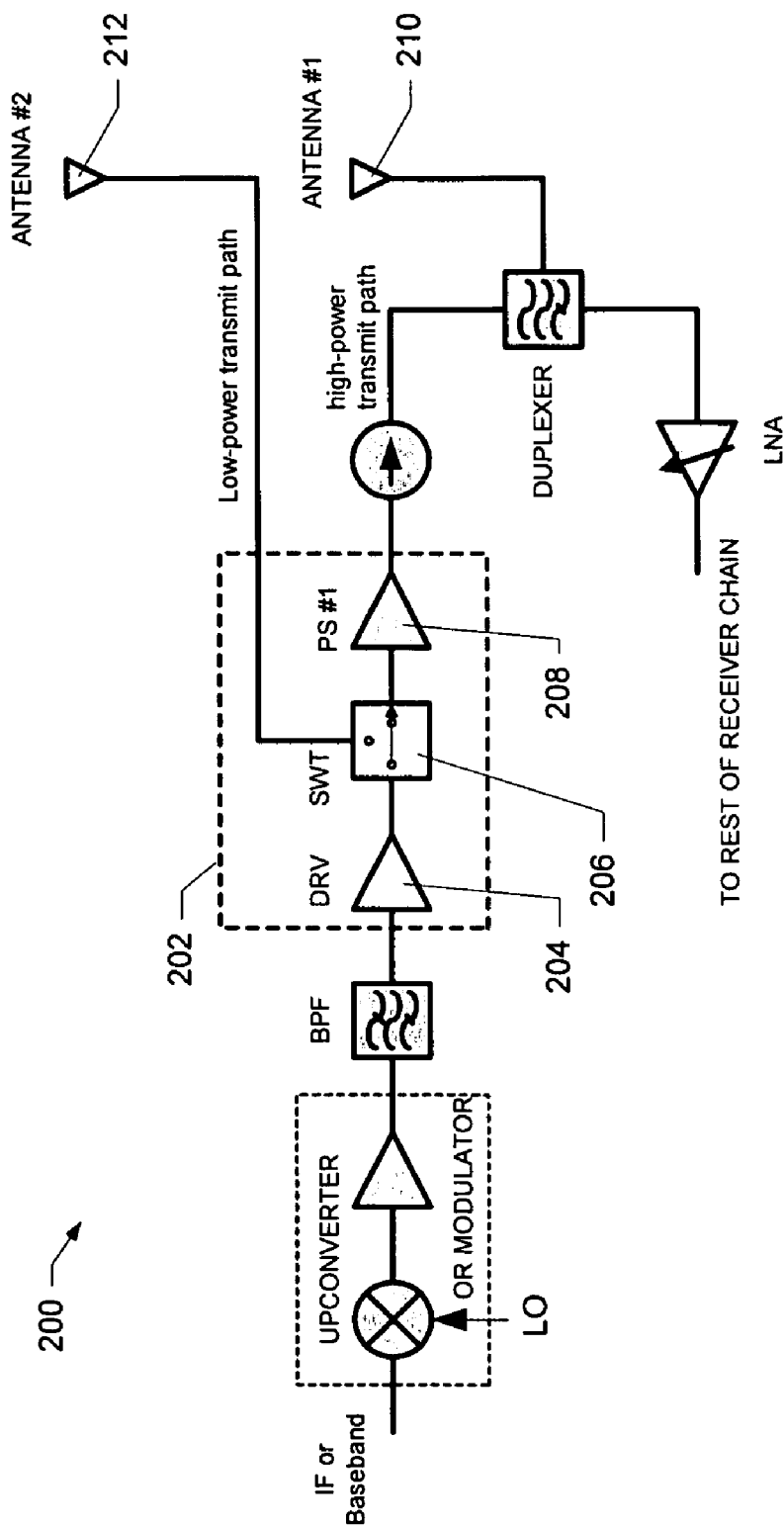
FIG. 2 is a simplified block diagram of an efficient RF amplifier designed according to another implementation.

Another transceiver 200 having an alternate front end topology is shown in FIG. 2. As will be appreciated, the implementation shown is similar to the implementation shown in FIG. 1 in a number of respects. By contrast, however, power amplification module 202 includes a driver stage 204 in series with a switch 206 and a power amplifier 208. Switch 206 alternately enables the main or high-power transmit path (in which amplifier 208 transmits power via antenna 210), and a low-power transmit path (in which the output of driver 204 is transmitted via antenna 212). When the low-power transmit path is enabled, power amplifier 208 is disabled (e.g., turned off or quiesced). And as with the embodiment shown in FIG. 1, either or both of driver stage 204 and power amplifier 208 may be implemented as highly efficient power amplifiers using well-optimized global feedback loops with noise-shaping capability.

Figure 3:
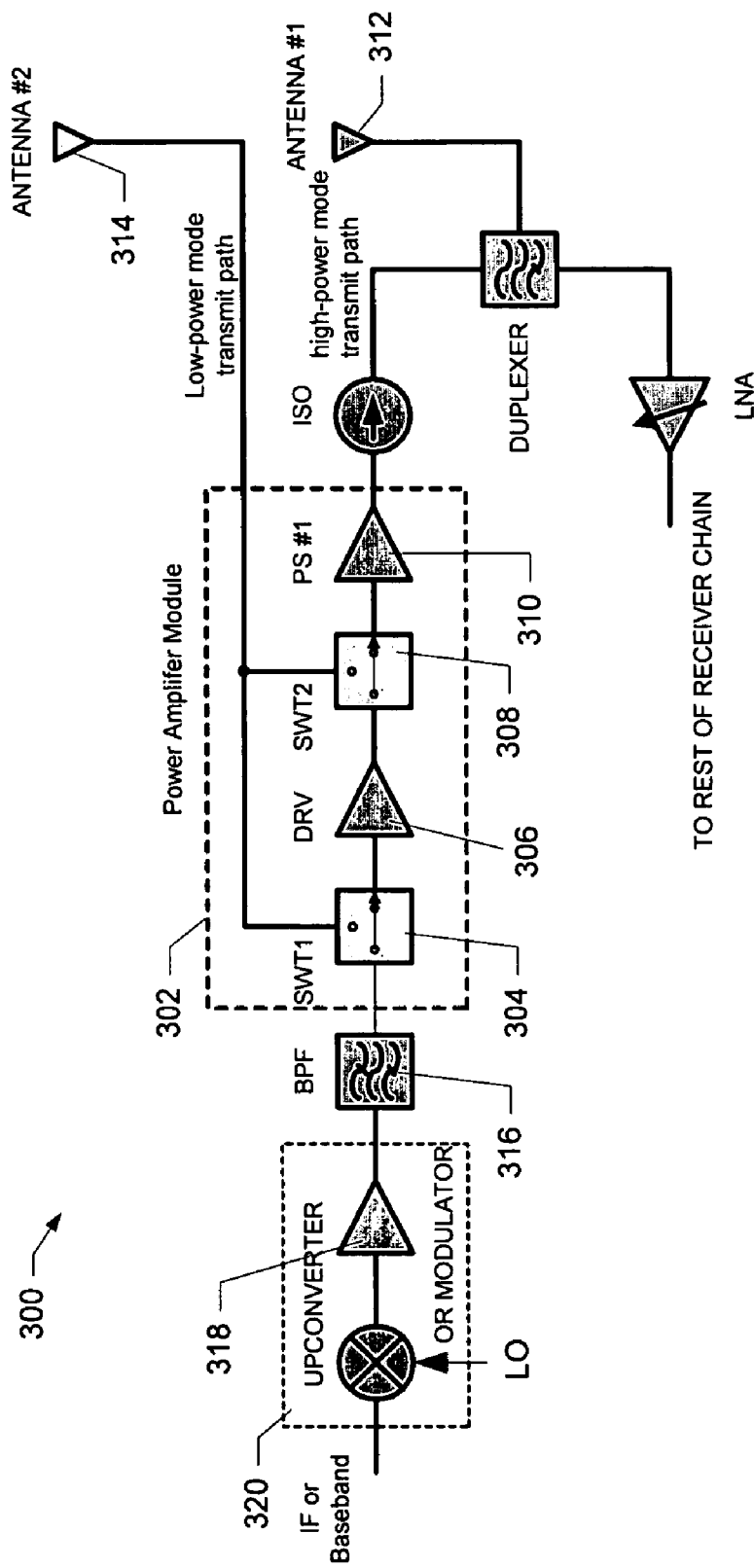
FIG. 3 is a simplified block diagram of an efficient RF amplifier designed according to yet another embodiment of the invention.

According to another embodiment of the invention, a transceiver 300 having a further alternate front end topology is shown in FIG. 3. Again, transceiver 300 shares many of the features of transceivers 100 and 200 of FIGS. 1 and 2. However, by contrast power amplification module 302 includes a first switch 304 in series with a driver stage 306, a second switch 308, and a power amplifier 310. According to this embodiment, three different power modes are enabled, a high-power transmit mode (in which amplifier 310 transmits power via antenna 312), and two distinct low-power modes (in which power is transmitted via antenna 314).

In a first low-power mode of operation, switch 304 connects the output of BPF 316 to the input of driver stage 306, while switch 308 connects the output of driver stage 306 to the low-power transmit path such that driver stage 306 is transmitting output power via antenna 314. In a second, even lower-power mode of operation, switch 304 connects the output of BPF 316 to the low power transmit path such that output driver 318 of upconverter/modulator 320 drives antenna 314.

When either of the low-power transmit paths is enabled, power amplifier 310 is disabled (e.g., turned off or quiesced). In addition, in the second low power mode, driver stage 306 may also be disabled to further enhance efficiency. And as with the implementations described above, either or both of driver stage 306 and power amplifier 310 may be implemented as highly efficient power amplifiers using well-optimized global feedback loops with noise-shaping capability.

As discussed above, the amplifiers and drivers used with the various embodiments of the invention may be optimized for their intended output power ranges. According to a particular set of embodiments, this optimization takes the form of global feedback having noise-shaping capability. To understand how noise shaping may be applied to RF power amplifiers, it may be instructive to start with a description of a particular application to base band amplifiers. The basic idea may be understood with reference to FIG. 4. Additional details regarding exemplary techniques for base band and band pass noise-shaping are provided in U.S. Pat. Nos. 5,777,512 and 6,628,166, the entire disclosures of which are incorporated herein by reference for all purposes.

Curve 402 represents a signal transfer function which is the frequency response from the input to the output of a base band amplifier. Curve 404 represents the noise function of the amplifier, i.e., the noise power as seen at the output of the amplifier. Signal transfer function 402 resembles a low-pass filter while noise function 404 is similar to a high-pass filter response. As shown in the figure, the noise is attenuated heavily within the desired band, i.e., shaded region 406. Outside the desired band, the noise begins to increase. However, because this is a base band application, this increase is of little consequence. Thus, the noise is effectively shaped away from the desired band into the out-of-band region.

For band pass applications (e.g., RF), a similar mechanism (illustrated in FIG. 5) may be employed. For noise or distortion, noise function 502 acts like a band-reject filter. Distortion is thus minimized in the desired band 504 identified by some frequencies between f1 and f2.

As mentioned above, embodiments of the present invention may employ highly efficient amplifiers using well-optimized global feedback loops with noise-shaping capability. According to one class of embodiments, an amplifier configuration is provided in which noise shaping feedback techniques are employed to reduce in-band distortion even where a feedback loop including the power switching device(s) is broken during some portion of the operational cycle. This is achieved by providing a feed forward path in parallel with a portion of the forward signal path of the amplifier which maintains loop integrity during all portions of amplifier operation. That is, the feed forward path facilitates the use of negative feedback in amplifier topologies for which such techniques were previously problematic because of loop stability problems.

Figure 6:
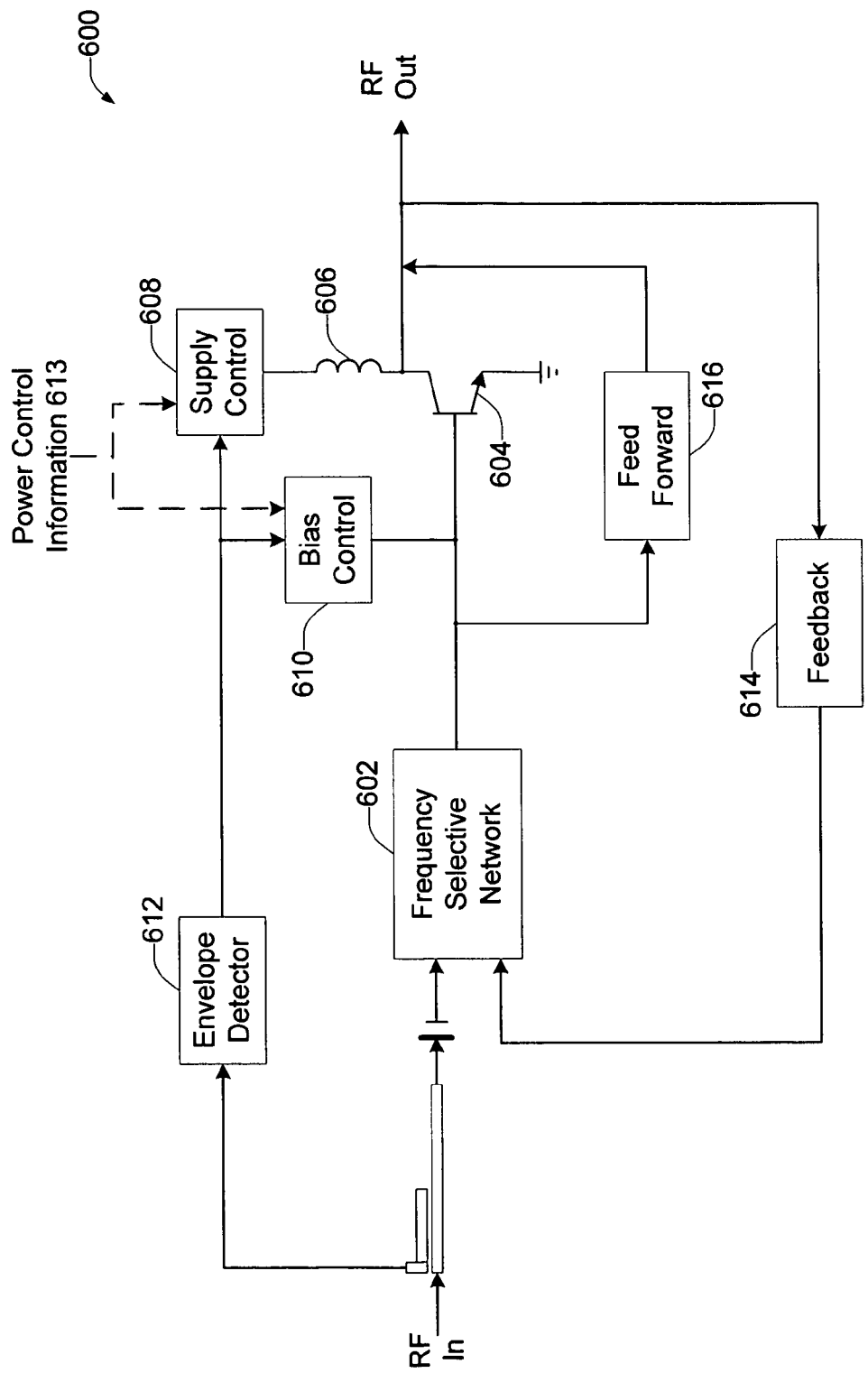
FIG. 6 is a simplified block diagram of an amplifier topology which may be used to implement specific embodiments of the invention.

FIG. 6 is a simplified block diagram of such an exemplary amplifier 600 which may be used with specific embodiments of the invention. The main forward signal path includes a noise-shaping frequency selective network 602 for reducing in-band and close-in (e.g., adjacent-channel or alternate-channel) noise. Frequency selective network 602 may include one or more resonator stages. The power amplification stage includes a single common-emitter transistor 604 coupled through an inductor 606 to supply control circuitry 608 which provides the supply voltage. The bias current for transistor 604 is supplied by bias control circuitry 610.

Supply control circuitry 608 and bias control circuitry 610 are part of a dual bias control scheme which manipulates the operation point of transistor 604. This may be done using a variety of mechanisms and for a variety of reasons including, for example, improved efficiency for a given input signal level as indicated by envelope detection circuitry 612. In addition or alternatively, supply control circuitry 608 may set the bias voltage for the power amplification stage to achieve a given output power level as dictated by power control bits received from a nearby base station (power control information signal 613). Independent of or in conjunction with this, bias control circuitry 610 may be used to manipulate the bias current to transistor 604 for improved power efficiency for a given bias voltage using, for example, information from either of circuitry 612 or signal 613.

Each of supply control circuitry 608 and bias control circuitry 610 can select its bias point from among a plurality of bias points in response to any of a variety of stimuli. That is, for example, supply control circuitry 608 could be operable to select from among a plurality of supply voltages in response to the input signal level, power control bits, battery charge level, etc. Similarly, bias control circuitry 610 could be operable to select from among a plurality of bias currents based on any of these or additional stimuli.

A continuous-time feedback path 614 provides negative feedback to noise shaping frequency selective network 602. The amount of improvement in the intermodulation product is roughly equal to loop gain with network 602 and feedback 614 providing a higher gain within the band of interest. The improvement of close-in distortion is achieved at the expense of higher distortion products outside of the band of interest. However, such distortion can be filtered out using, for example, a matching network. Feedback circuitry 614 may comprise any combination of active and passive elements for achieving a wide variety of feedback objects including, for example, increasing bandwidth, increasing linearity, gain control, bias stabilization, and impedance control.

As is well known, when an amplification stage in a conventional feedback loop is biased close to class B operation, loop stability becomes very difficult to maintain. This is due to the fact that the power device is typically turned off during most of the negative cycle resulting in an open loop. This opening and closing of the loop during each cycle causes instability. This stability problem is solved by the amplifier topology of FIG. 6 by providing a feed forward path in parallel with the amplification stage which ensures feedback loop integrity regardless of the state of the power device(s) upon which the amplification stage is based. This, in turn, allows the amplification stage of the amplifier (e.g., transistor 604) to be biased well below the bias points achievable with previous amplifier designs resulting in significant power efficiency improvements.

As illustrated in FIG. 6, feed forward circuitry 616 is provided which bypasses transistor 604 and maintains a closed feedback loop (including feedback circuitry 614 and frequency selective network 602) even when transistor 604 is not conducting. With the introduction of feed forward circuitry 616, transistor 604 may be biased very closely to class B operation. That is, the negative feedback and noise shaping provided by feedback circuitry 614 and frequency selective network 602 reduce the distortion due to the increased intermodulation product resulting from more extreme bias control points, while feed forward circuitry 616 stabilizes the loop. According to various implementations, feed forward circuitry 616 may comprise any unilateral circuits such as, for example, small active devices biased in the linear region. Additional details regarding the application of noise-shaping techniques in stable amplifier loops may be found in U.S. Pat. No. 6,621,339, the entire disclosure of which is incorporated herein by reference for all purposes.

While the invention has been particularly shown and described with reference to specific embodiments thereof, it will be understood by those skilled in the art that changes in the form and details of the disclosed embodiments may be made without departing from the spirit or scope of the invention. In addition, although various advantages, aspects, and objects of the present invention have been discussed herein with reference to various embodiments, it will be understood that the scope of the invention should not be limited by reference to such advantages, aspects, and objects. Rather, the scope of the invention should be determined with reference to the appended claims.

What is claimed is:

1. A transceiver, comprising:
    a modulator stage operable to receive an input signal and generate a modulated signal;
    a band pass filter operable to filter the modulated signal and generate a filtered signal;
    a first transmit path including a first amplifier operable in a first transmit mode to receive the filtered signal and generate a first amplified signal, the first amplified signal being characterized by a first power range;
    a first antenna associated with the first transmit path and operable to transmit the first amplified signal;
    a second transmit path including a second amplifier operable in a second transmit mode to receive the filtered signal and generate a second amplified signal, the second amplified signal being characterized by a second power range lower than the first power range;
    a second antenna associated with the second transmit path and operable to transmit the second amplified signal;
    a switch operable to alternately provide the filtered signal to the first and second transmit paths; and
    control circuitry operable to disable the first amplifier in the second transmit mode, and to disable the second amplifier in the first transmit mode.

2. The transceiver of claim 1 further comprising a receive path, and a duplexer, the duplexer facilitating sharing of the first antenna between the first transmit path and the receive path.

3. The transceiver of claim 1 wherein at least one of the first and second amplifiers employs noise-shaping feedback.

4. The transceiver of claim 1 wherein at least one of the first and second amplifiers includes optimization circuitry for optimizing operation of the at least one of the first and second amplifiers at different power levels.

5. The transceiver of claim 1 wherein the transceiver comprises a radio frequency transceiver.

6. The transceiver of claim 1 wherein the switch comprises a radio frequency splitter.

7. A communication device comprising the transceiver of claim 1.

8. The communication device of claim 7 wherein the communication device comprises one of a CDMA mobile device, a CDMA2000 mobile device, or a WCDMA/UMTS mobile device.

9. The communication device of claim 7 wherein the communication device comprises one of a CDMA base station, a CDMA2000 base station, or a WCDMA/UMTS base station.

10. A transceiver, comprising:
    a modulator stage operable to receive an input signal and generate a modulated signal;
    a band pass filter operable to filter the modulated signal and generate a filtered signal;
    a first transmit path operable in a first transmit mode to receive the filtered signal, the filtered signal being characterized by a first power range;
    a second transmit path including a first amplifier operable in a second transmit mode to receive the filtered signal and generate a first amplified signal, the first amplified signal being characterized by a second power range higher than the first power range;
    a first antenna associated with the first and second transmit paths and operable to transmit the filtered signal in the first transmit mode and the first amplified signal in the second transmit mode;
    a third transmit path including a second amplifier operable in a third transmit mode to receive the first amplified signal and generate a second amplified signal, the second amplified signal being characterized by a third power range higher than the second power range;
    a second antenna associated with the second transmit path and operable to transmit the second amplified signal;
    a first switch operable to alternately provide the filtered signal to the first and second transmit paths;
    a second switch operable to alternately provide the first amplified signal to the second and third transmit paths; and
    control circuitry operable to disable the first and second amplifiers in the first transmit mode, and to disable the second amplifier in the second transmit mode.

11. The transceiver of claim 10 further comprising a receive path, and a duplexer, the duplexer facilitating sharing of the second antenna between the third transmit path and the receive path.

12. The transceiver of claim 10 wherein at least one of the first and second amplifiers employs noise-shaping feedback.

13. The transceiver of claim 10 wherein at least one of the first and second amplifiers includes optimization circuitry for optimizing operation of the at least one of the first and second amplifiers at different power levels.

14. The transceiver of claim 10 wherein the transceiver comprises a radio frequency transceiver.

15. The transceiver of claim 10 wherein the first and second switches comprise radio frequency splitters.

16. A communication device comprising the transceiver of claim 10.

17. The communication device of claim 16 wherein the communication device comprises one of a CDMA mobile device, a CDMA2000 mobile device, or a WCDMA/UMTS mobile device.

18. The communication device of claim 16 wherein the communication device comprises one of a CDMA base station, a CDMA2000 base station, or a WCDMA/UMTS base station.

* * * * *